(12) United States Patent
Choi (10) Patent No.: US 6,534,343 B2
(45) Date of Patent: Mar. 18, 2003

(54) METHOD OF MAKING ELECTRICALLY ISOLATED POWER SEMICONDUCTOR PACKAGE

(75) Inventor: Kang Rim Choi, Cupertino, CA (US)

(73) Assignee: Ixys Corporation, Santa Clara, CA (US)

(*) Notice: Subject to any disclaimer, the term of this patent is extended or adjusted under 35 U.S.C. 154(b) by 0 days.

(21) Appl. No.: 09/851,696

(22) Filed: May 8, 2001

(65) Prior Publication Data

US 2001/0018235 A1 Aug. 30, 2001

Related U.S. Application Data

(62) Division of application No. 09/134,664, filed on Jul. 31, 1998, now Pat. No. 6,404,065.

(51) Int. Cl.[7] .............................................. H01L 21/48
(52) U.S. Cl. ...................................... 438/122; 438/123
(58) Field of Search ................................ 438/106, 110, 438/111, 112, 121, 122, 123, 124; 257/675

(56) References Cited

U.S. PATENT DOCUMENTS

| | | |
|---|---|---|
| 4,278,990 A | 7/1981 | Fichot |
| 4,563,383 A | 1/1986 | Kuneman et al. |
| 5,198,885 A | 3/1993 | Ibrahim |
| 5,519,936 A | 5/1996 | Andros et al. |
| 5,561,323 A | 10/1996 | Andros et al. |
| 5,596,231 A | 1/1997 | Combs |
| 5,601,932 A | 2/1997 | Krum et al. |
| 5,637,922 A | 6/1997 | Fillion et al. |
| 5,650,662 A | 7/1997 | Edwards et al. |
| 5,675,181 A | 10/1997 | Nishiura et al. |
| 5,767,573 A | 6/1998 | Noda et al. |
| 5,783,466 A | 7/1998 | Takahashi |
| 5,942,797 A | 8/1999 | Terasawa |

*Primary Examiner*—Kamand Cuneo
*Assistant Examiner*—Evan Pert
(74) *Attorney, Agent, or Firm*—Townsend and Townsend and Crew LLP (57) ABSTRACT

A packaged power semiconductor device (24) with voltage isolation between a metal backside (34) and the terminals (38) of the device. A direct-bonded copper ("DBC") substrate (28) is used to provide electrical isolation and good thermal transfer from the device to a heatsink. A power semiconductor die (26) is soldered or otherwise mounted to a first metal layer (30) of the DBC substrate. The first metal layer spreads heat generated by the semiconductor die. The leads and die may be soldered to the DBC substrate in a single operation. In one embodiment, over 3,000 Volts of isolation is achieved. In another embodiment, the packaged power semiconductor device conforms to a TO-247 outline.

5 Claims, 6 Drawing Sheets

FIG. 5A CHIP ATTACHED STRIP

FIG. 5B

FIG. 5C ASSEMBLED UNIT

METHOD OF MAKING ELECTRICALLY ISOLATED POWER SEMICONDUCTOR PACKAGE

CROSS-REFERENCES TO RELATED APPLICATIONS

The present application is a Divisional Application of and claims the benefit of U.S. patent application Ser. No. 09/134,664, filed on Jul. 31, 1998, now U.S. Pat. No. 6,404,065, which is incorporated by reference in its entirety for all purposes.

BACKGROUND OF THE INVENTION

This invention relates to electronic devices, and more particularly to a packaged power semiconductor device with a metal back plane that is electrically isolated from the terminals of the device.

Most power semiconductor devices like silicon-controlled rectifiers ("SCRs"), power transistors, insulated-gate bipolar transistors ("IGBTs"), metal-oxide-semiconductor field-effect transistors ("MOSFETs"), power rectifiers, power regulators, or combinations thereof, are assembled in packages that are not electrically isolated. That is, a metal tab, which typically forms the backside of the packaged device, is electrically coupled, e.g. soldered, to the semiconductor die within the packaged device. This places the backside of the package at the same electrical potential as the semiconductor die.

Power semiconductor devices are designed to operate at relatively high voltages, typically 30–1,000 V, or higher, compared to other electronic semiconductor devices, such as logic or memory devices. In a conventional packaged power semiconductor device, the backside of the package may be subject to these voltages under normal operation or if a device failure occurs. Additionally, the power semiconductor device may be exposed to voltages outside of the intended range during operation, which may electrically couple to the backside of the package.

The high voltages present at the backside of conventional packaged power semiconductor devices may damage other circuit components or may present a safety hazard to personnel operating equipment built with these devices. Voltages as low as 40 Volts can be a hazard to operators working with or on such equipment. Insulating pads or washers are typically used to electrically isolate the backside of the power semiconductor device from the rest of the circuit. In a typical application, the power semiconductor is mounted on a heatsink that is part of an electrical chassis at ground potential.

Heatsinking is important for power semiconductor devices because of the power dissipated by some devices during operation, and also because of the environment that the device may have to operate in. Power semiconductor devices are often used in applications that may get relatively hot, .such as in an engine compartment or in a factory. Thus, it is especially important to minimize the thermal resistance between the active device, which may be generating several Watts or even several kilowatts of power, and the environment, which may be an elevated temperature.

Figure 1A:
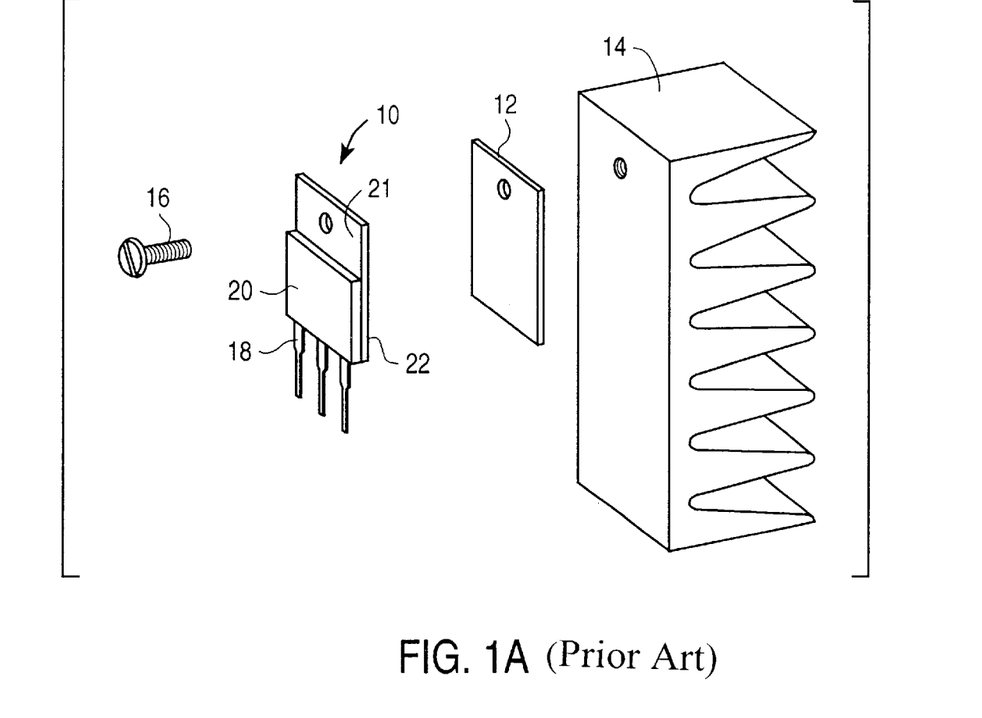
FIG. 1A is a simplified exploded view of a conventional packaged power semiconductor device mounted to a heatsink with an intervening insulating pad.

FIG. 1A is a simplified exploded view of a packaged power semiconductor device 10, an insulating pad 12, a heatsink 14, and a screw 16. The screw is used to attach the semiconductor device and the insulating pad to the heatsink. The semiconductor die (not shown) is attached to a metal tab 21, leads 18 are electrically coupled to the terminal of the die, and the assembly is then encapsulated with encapsulating material 20. The encapsulating material is typically epoxy, plastic, rubber, silicone, or similar materials and is molded, cast, or otherwise formed over the die and related structures.

The heatsink 14 is usually metal, and the insulating pad 12 is typically made of an insulting material such as silicone rubber, mica, or ceramic, and may be in the form of a washer or other shape, rather than a pad. It is desirable that the insulating pad 12 provide electronic isolation between the backside 22 of the power semiconductor device 10 and the heatsink 14 while also providing good thermal coupling to the heat sink.

Figure 1B:
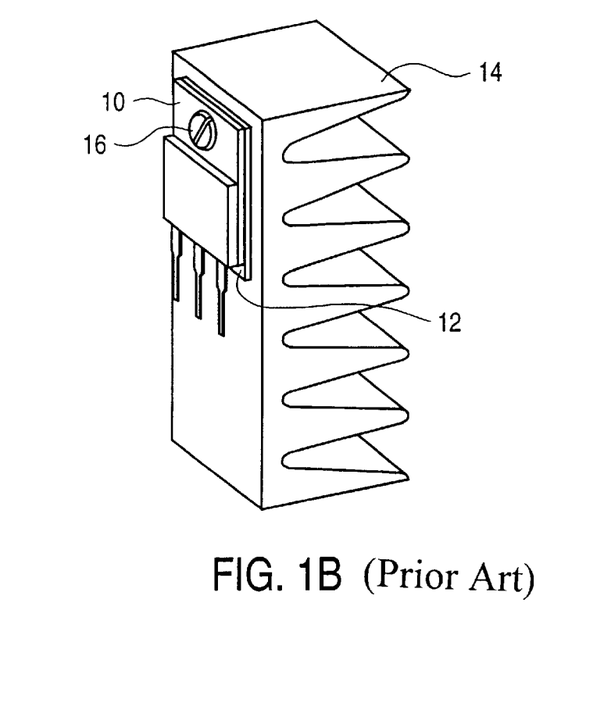
FIG. 1B is a simplified view of the assembled components shown in FIG. 1A.

FIG. 1B is a simplified view of the power semiconductor device.10 and the insulating pad 12 mounted to the heatsink 14 with the screw 16. The screw can be made of an insulating material, such as nylon, or additional insulating washers and/or sleeves can be used to isolate the power semiconductor device from the heatsink. In some applications, it may be necessary to provide enhanced heat-sinking. Soldering the power semiconductor device to the heatsink will provide superior thermal coupling. However, the heatsink would typically need to be isolated from the rest of the circuit or chassis, and may require a shield to prevent a technician from inadvertently touching an electrically "hot" heatsink, which could be at a lethal voltage.

Adding electrical isolation between a power semiconductor device and the heatsink reduces thermal coupling to the heatsink and requires additional parts and assembly. Providing electrical isolation between a heatsink and the chassis similarly involves additional parts and assembly. The additional parts and assembly not only increases cost, but also provides an opportunity for human error, namely, omitting the isolation altogether. Additionally, some isolation pads are fragile, and may crack, tear or otherwise be damaged during assembly or subsequent use. Omission of, or damage to, the isolation pad may cause the isolation to fail and expose an operator to dangerous voltages.

Therefore, it is desirable to mount packaged power semiconductor devices to heatsinks or other circuit components without requiring additional parts or labor. It is further desirable that the packaged power semiconductor be mounted in a reliable and safe fashion, and that good thermal coupling between the packaged power semiconductor device and the heatsink be achieved. It is still further desirable that any such packaged power semiconductor device be adaptable to be retrofitted into existing applications.

SUMMARY OF THE INVENTION

The invention provides a packaged power semiconductor device having electrical isolation between the potential of a die inside the package and a metal back side of the package. A power semiconductor die is mounted on a direct-bonded copper ("DBC") substrate. The die may be mounted using solder or other die-attach means. A lead of the package is also soldered to the DBC substrate. In some embodiments, all leads are soldered to connecting pads on the DBC substrate.

A further understanding of the nature and advantages of the present invention may be realized by reference to the remaining portions of the specification and the drawings.

DESCRIPTION OF THE SPECIFIC EMBODIMENTS

The present invention provides a packaged power semiconductor device with superior safety, performance, and manufacturability. The present invention incorporates an insulative layer within the package of the device, between the semiconductor die and the backplane of the package.

Figure 2:
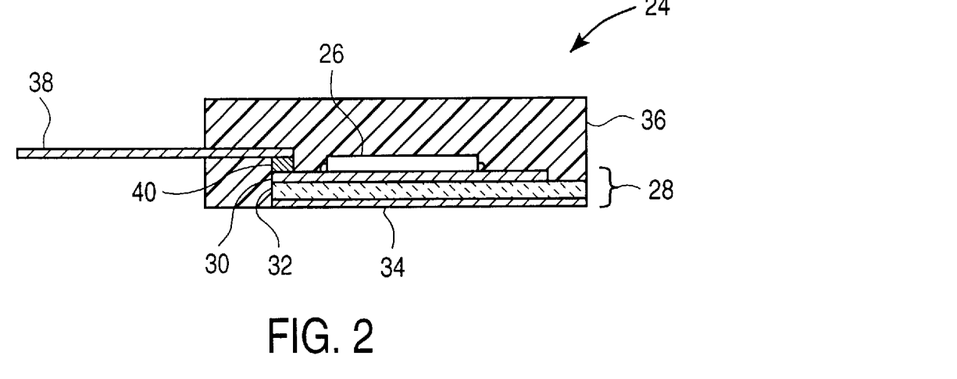
FIG. 2 is a simplified cross section of a power semiconductor die mounted on a DBC substrate and encapsulated.

FIG. 2 shows a simplified cross section of a packaged power semiconductor device 24 according to one embodiment of the present invention. A power semiconductor die 26 is soldered to a direct bonded copper ("DBC", also known as direct copper bonded ("DCB")) substrate 28. The DBC substrate 28 includes a die-side (first) layer of copper 30, a layer of ceramic 32, and a back-side (second) layer of copper 34. A layer of encapsulant 36 has been formed over the power semiconductor die 26, the DBC substrate 28, and device leads 38 (only one of which is shown) that is soldered 40 to the first layer of copper 30.

Additional metal layers may be included, for example, one or both of the copper layers could be tinned or plated. The insulator is alumina ($Al_2O_3$) ceramic, but could be other material, such as aluminum nitride (AlN), beryllium oxide (BeO), or other insulating material compatible with DBC fabrication. Each layer of copper is about 0.30 mm thick, and the alumina layer is about 0.630 mm thick, making the DEC substrate about 1.230 mm thick overall. However, these thickness are given as examples only and thicker or thinner layers could be used.

Figure 3:
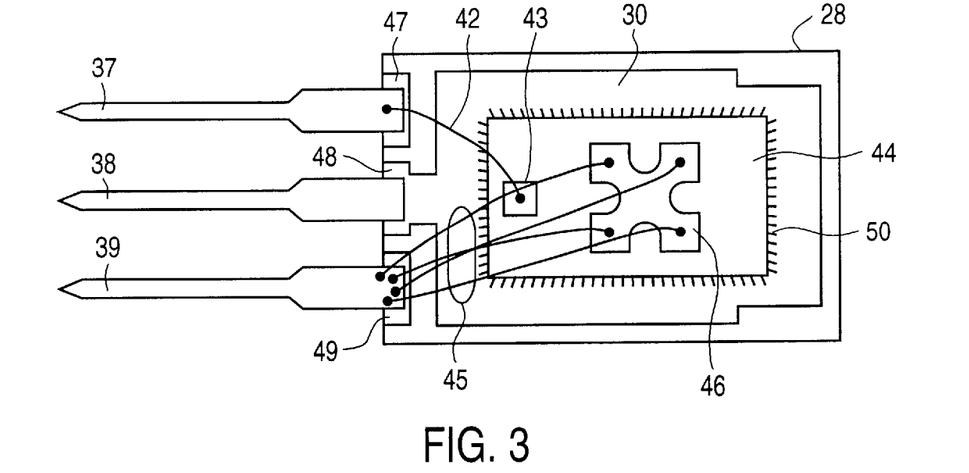
FIG. 3 is a simplified top view of a power semiconductor die attached to a DBC substrate and wire-bonded to leads.

FIG. 3 is a simplified top view of the device shown in FIG. 2 with the encapsulant layer removed. Three device leads 37, 38, 39 are integrated with a DBC substrate 28. The die-side copper layer 30 has been patterned to create lead connecting pads 47, 48, 49 that the leads are soldered to. One lead 37 is wire-bonded 42 to connect to one terminal 43 of a three-terminal device 44, such as the gate of an IGBT die. A second lead 39 is wire-bonded 45 to a second terminal 46 of the three-terminal device, such as the emitter of an IGBT die, and the third lead 38 is soldered to the die-side copper layer 30, which is electrically coupled to the collector of the die, which is also soldered 50 to the die-side copper layer. Other devices, such as a field-effect transistor (FET), which is also a three-terminal device may be used. Power FETs are designed to operate at voltages up to 3,000 Volts and currents of over 110 amps at 70 volts. Therefore, power dissipation is an important consideration for power semiconductor devices, as well as is electric isolation for operator safety.

Figure 4A:
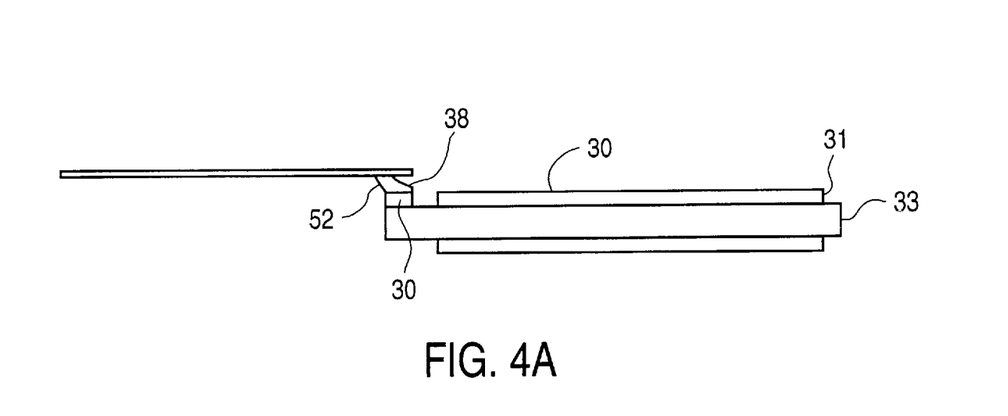
FIG. 4A is a simplified side view of a center lead soldered to the DBC substrate.

FIG. 4A is a simplified side view of the present invention adapted for a TO-247 outline with the plastic encapsulant removed; however, other embodiments may conform to other package outline, such as the TO-220, TO-264, or SOT-227B outlines. The center lead 38 is bent 52 to solder to the die-side copper layer 30 while raising the other two leads above the die-side copper layer. The other two leads are wire bonded or otherwise electrically coupled to the die, and the encapsulant (not shown) provides mechanical support for the leads. The edge 21 of the die-side copper layer 30 is set back from the edge 33 of the ceramic layer 32 so that the encapsulant will cover the edge of the die-side copper layer and provide electrical isolation from the top and sides of the package.

Figure 4B:
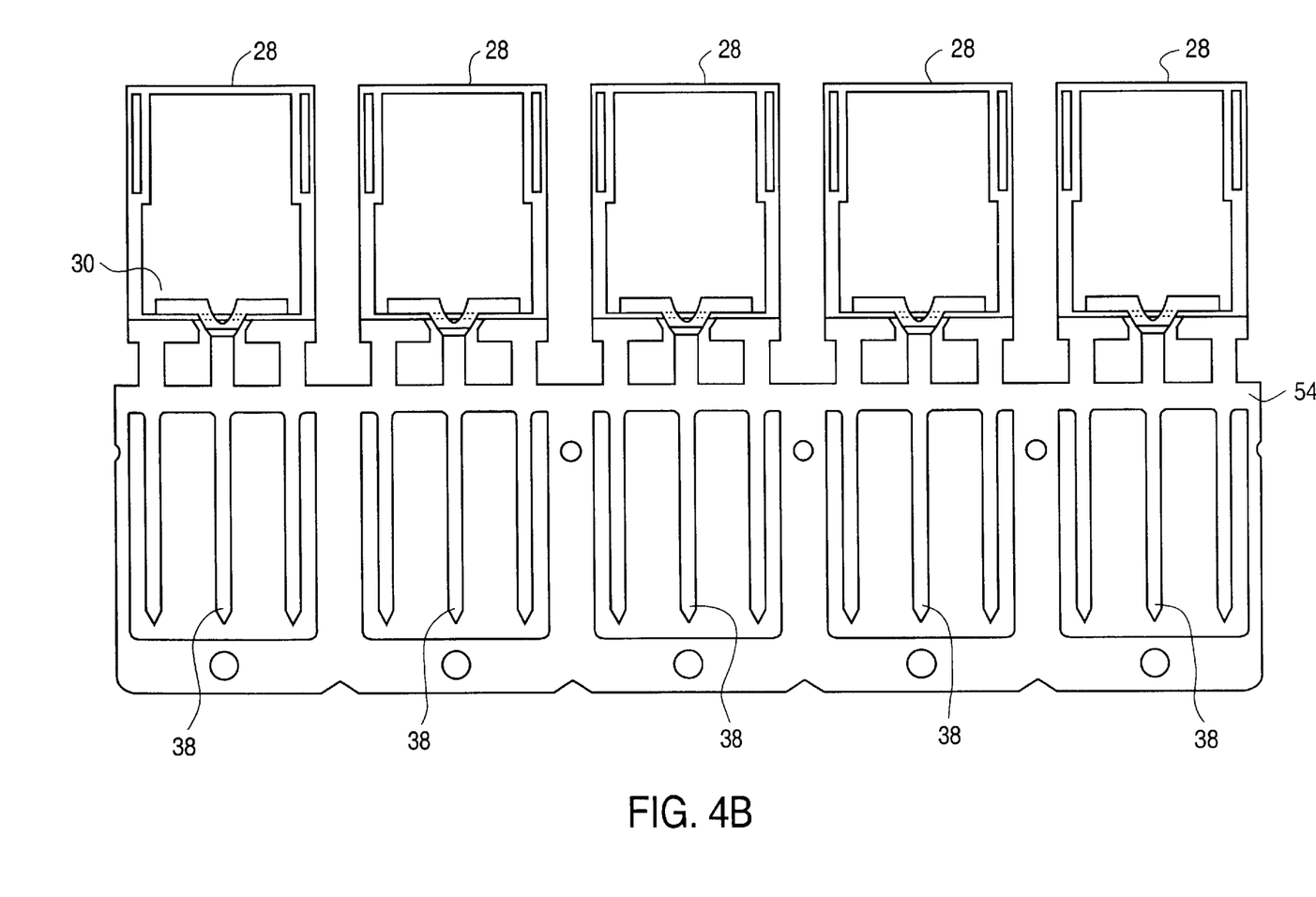
FIG. 4B is a simplified top view of a copper lead frame attached to a plurality of DBC substrates.

FIG. 4B is a simplified top view of a lead frame with DBC substrates 28 attached. The copper lead frame 54 is made from alloy 194, TAMAC-4, or equivalent, and is approximately 0.6 mm thick. The width of the DBC substrate is about 14.2 mm and the length of the DBC substrate is about 17.0 mm. As discussed above, the thickness of the DBC substrate is about 1.23 mm. The center leads 38 are soldered to the die-side copper layer 30 of the DBC substrates. After die attach and wire bonding, five unencapsulated devices will be cut from the lead frame using a trimming tool or other means, as are known in the art.

A molding press is loaded with unencapsulated devices and plastic encapsulant is heated and formed around the device in accordance with the appropriate package specification, if any. The yield through the encapsulation process is higher for DBC packaged devices than if similar devices with bare ceramic substrates were encapsulated. Using a DBC substrate reduces cracking of both the substrate and the semiconductor die. Cracking of the substrate is reduced because the composite DBC structure provides support for the ceramic layer. Cracking of the semiconductor die is also reduced because the thermal expansion coefficient of copper more closely matches that of silicon than does the thermal expansion coefficient of typical ceramics.

Furthermore, using a bare ceramic substrate for a packaged power semiconductor device typically increases costs and reduces thermal performance compared to a DBC packaged power semiconductor device according to the present invention. First, in order to attach the die to a ceramic substrate, a die attach pad is usually provided. This is often done by silk-screening a metal-glass frit onto the ceramic substrate and firing the frit. The metal in the frit is usually an expensive noble metal, and the screening and firing process results in additional yield loss. Second, the thermal performance of a package with a bare ceramic substrate is inferior to the DBC package.

The die-side copper layer of the DBC package serves as a heat-spreading layer to basically increase the heat-transfer area from the "footprint" of the semiconductor die out to nearly the entire DBC substrate area, i.e. the area of the die-side copper layer. For a given thickness of ceramic, which typically has higher thermal resistance than copper, a larger heat-transfer area will provide superior heat transfer across the high-resistance layer, as those skilled in the art will appreciate.

The back-side copper layer also improves the thermal performance of the DBC package in a number of ways. Although the die-side copper layer spreads the heat from the die, the temperature in the vicinity of the die ("underneath" the die) will be higher than the temperature at the edge of the die-side copper layer. The extent of this heat gradient depends on many factors; however, the back-side copper layer serves to spread the heat transferred across the ceramic layer and reduce the formation of a hot-spot underneath the die. Heat spreading from both copper layers also reduces heat-related stress and resultant cracking of the substrate and/or die, thus improving reliability.

Additionally, the direct-bonding process intimately attaches the copper to the ceramic, providing for excellent thermal conduction from one layer to the next. This thermal conduction is better than typically occurs when contacting a bare ceramic substrate against a heatsink. The high thermal resistance of the ceramic impedes lateral heat spreading, so that each microscopic contact point with the heatsink becomes a hot-spot, while the heat-conductivity of the back-side copper layer provides good lateral heat conduction, reducing the consequences of localized contact with the heatsink. Finally, the back-side copper layer allows the DBC packaged device to be soldered to a heatsink, thermally coupling the entire area of the back-side layer to the heatsink.

Even if the back side of a ceramic substrate were coated with frit and fired, the thermal performance would not equal that of the DBC packaged device, as the metal-glass matrix of the fired frit does not conduct heat as well at the copper layer of the DBC packaged device. Therefore, the DBC packaged power device can thermally couple to a heatsink while providing electrical isolation.

Figure 5A:
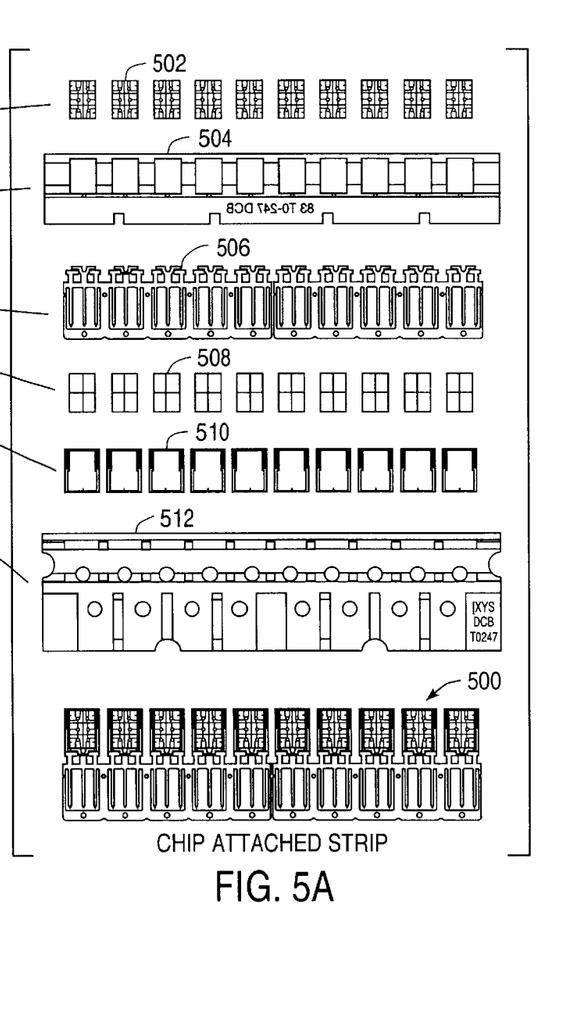
FIG. 5A is a simplified exploded top view of components and tools used to fabricate a chip-attached strip.
Figure 5B:
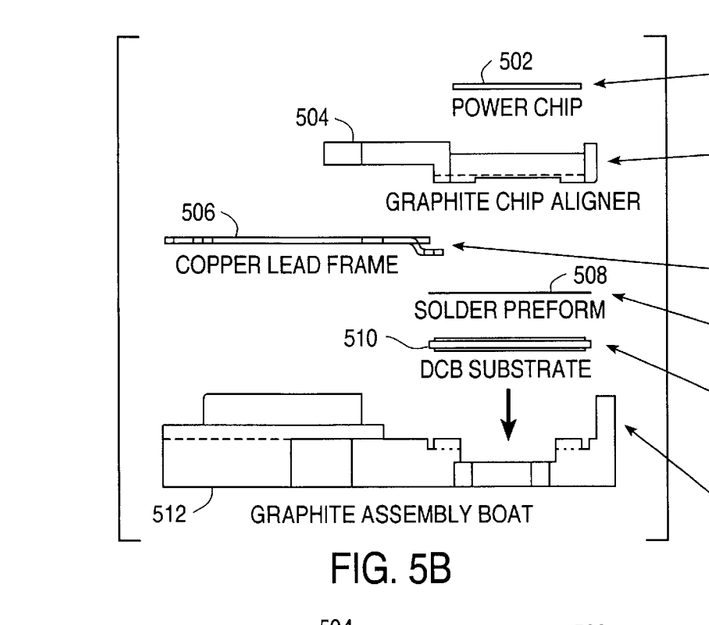
FIG. 5B is a simplified exploded side view of components and tools used to fabricate a chip-attached strip.
Figure 5C:
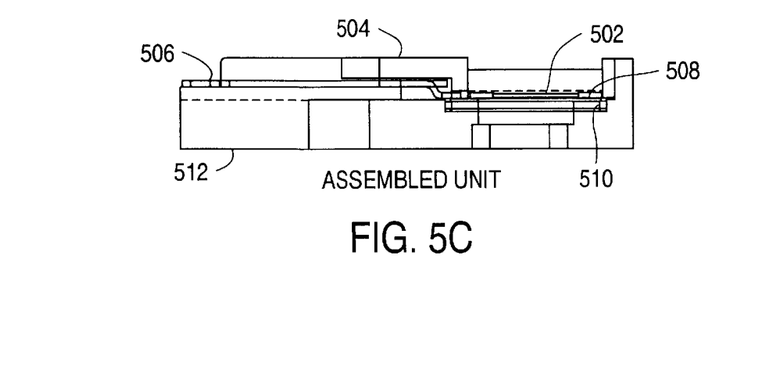
FIG. 5C is a simplified side view of an assembly boat and components for simultaneously soldering semiconductor dice and copper leads to DBC substrates.

FIGS. 5A–5C illustrate an assembly procedure for attaching leads and dice to DBC substrates in a single soldering operation. FIG. 5A is an exploded top view of the piece parts used to fabricate a chip-attached strip 500 that will be used to fabricate a number of TO-247 packaged isolated power semiconductor devices, as an example. Those skilled in the art will appreciate that the TO-247 package is a Joint Electronic Device Engineering Council ("JEDEC") standard package configuration that is often used with power semiconductor die to produce packaged power semiconductor devices. Other package configurations could be used in the assembly process, such as the TO-220 or TO-264 style packages, with appropriate modification of the tooling and other components. The components and tools include power semiconductor dice (chips) 502, a chip aligner tool 504, made from graphite, a copper lead frame 506, solder preforms 508, DBC substrates 510, and an assembly boat 512, also made from graphite. The chip aligner tool and assembly boat could be made with other material compatible with the intended assembly process, such as alumina, quartz, boron nitride, or others.

FIG. 5B is an exploded side view of the components and tools, and FIG. 5C is the assembled unit with the chip aligner tool 504 and the assembly boat 512 holding the power semiconductor die 502 and the copper lead frame 506 in proper alignment to the DBC substrate 510 and solder preform 508.

Figure 5D:
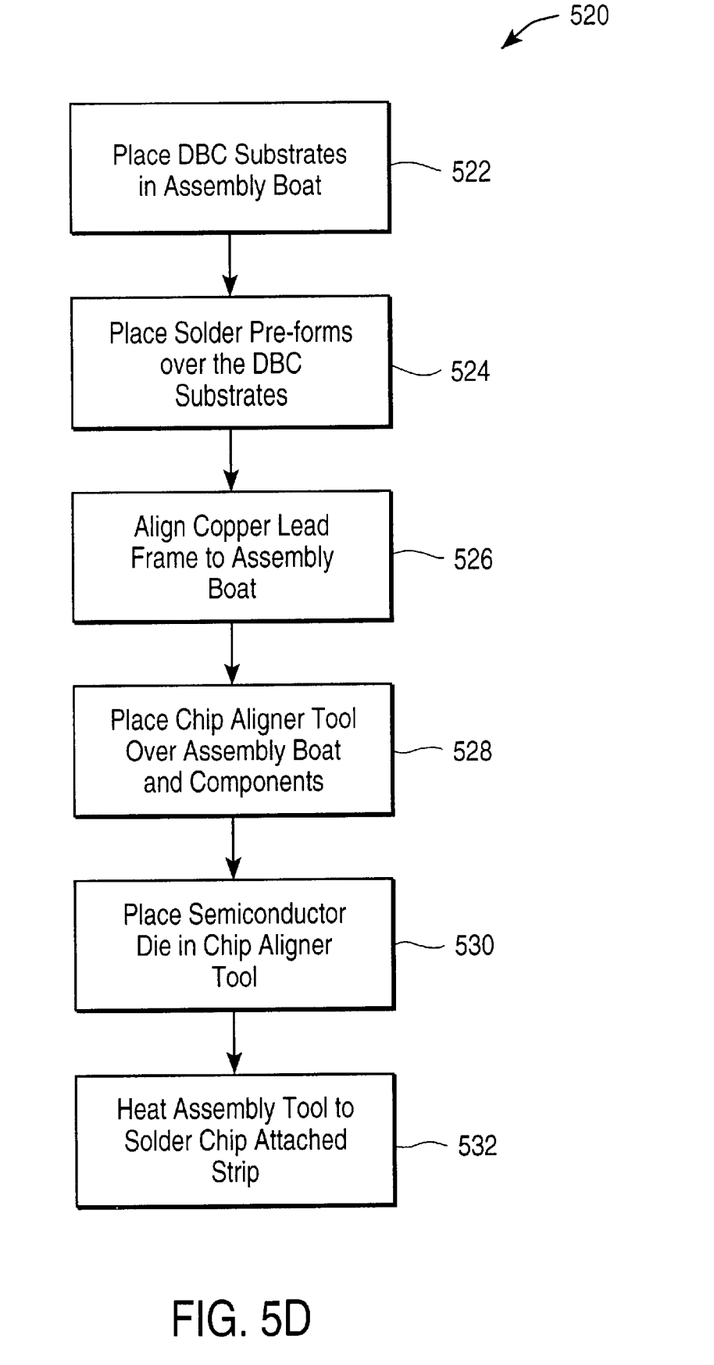
FIG. 5D is a simplified flow chart of a process for assembling die and leads to a DBC substrate.

FIG. 5D is a flow diagram for an assembly process 520 of a TO-247 chip-attached strip according to one embodiment of the present invention. The DBC substrates are placed in machined pockets in the assembly boat (step 522). The solder preforms are placed over the DBC substrates (step 524). The copper lead frame is placed in a separate machined pocket to align the contact pads of the lead frame to the contact pads of the patterned die-side copper layer of the DBC substrate (step 526). The chip aligner tool is placed over the assembly boat, further holding the leads in proper alignment to the DBC substrate (step 528), and the power semiconductor dice are placed in pockets in the chip aligner tool that align the chip to the DBC substrate (step 530). The assembly is then heated to melt the-solder and to concurrently solder the copper lead frame and power semiconductor dice to the DBC substrates (step 532). The solder process is typically carried out in a single pass in a reflow belt furnace in a reducing atmosphere, thus eliminating the need for a solder flux, as is known in the art, but other furnaces or heat sources could be used.

Additionally, the chip could be attached to the DBC substrate in one operation and the leads attached in another, such as using a high-temperature solder or braze, or eutectic die attach, for the chip attach, and another solder, spot-weld, or similar operation for the lead attach. DBC substrates could be attached to lead frames, and these subassemblies could be shipped to an assembly facility, where the semiconductor dice would be attached and the wire-bonding and encapsulation performed. Normally, the first attachment process, whether it be used to attach the leads or the dice, results in an attachment that is reliable at the temperature of the second attachment process.

In one embodiment, the solder preform is a sheet of solder that is oversized in comparison to the DBC substrate. When the solder melts, it wets only the metal parts of the assembly, thus leaving the ceramic portions of the substrate and the assembly tools bare of solder.

Alternatively, the chip aligner tool is not necessary if power semiconductor dice have solder pre-applied to the back of the dice. In that instance, the dice will self-align to the right spot on the DBC substrate. Self-alignment may be facilitated by patterning the die-side copper layer in accordance with the footprint of the intended semiconductor die. Alternatively, automated die placement or die bonding equipment can be used to place each die on the DBC substrate.

Figure 6A:
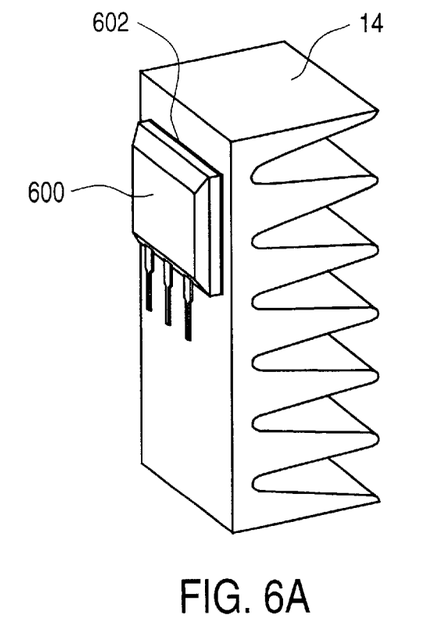
FIG. 6A is a simplified view of a power semiconductor device, according to an embodiment of the present invention, soldered to a heatsink.

FIG. 6A is a simplified view of a DBC packaged power semiconductor device 600 soldered 602 to a heatsink 14. Alternatively, the DBC packaged power semiconductor device could be clipped, screwed, bolted, or otherwise attached to the heatsink.

Figure 6B:
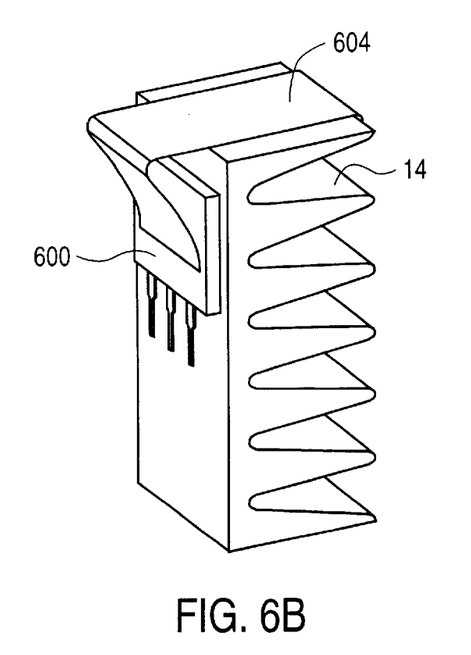
FIG. 6B is a simplified view of a power semiconductor device, according to an embodiment of the present invention, clipped to a heatsink.

FIG. 6B is a simplified side view of a DBC power semiconductor device 600 attached to a heatsink 14 with a clip 604. The clip is metal, such as spring steel or beryllium-copper, or plastic.

If the DBC packaged power semiconductor device were to be screwed or bolted to the.heatsink, an appropriate mounting hole can be provided in the package; however, using solder or a clip to attach the device to the heatsink eliminates the need for such a hole. This allows a larger die to be mounted in the package, and eliminates the problem of isolating the mounting hardware from the high voltage, as the plastic encapsulant isolates the clip. Additionally, the heatsink is shown as a representation only, and could take other forms, such as a ground plane of a printed circuit board, or a metal chassis.

In addition to isolating an operator from the operating voltage of the device, the DEC substrate can also provide isolation to meet safety requirements. As discussed above, power semiconductor devices are often used in industrial environments. Even if the device is not operated at a lethal voltage, the device may become exposed to a lethal voltage. In such a situation, it is very important to protect an operator, who may be electrically coupled to the chassis and heatsink of the device, from harm. A device according to the present invention was fabricated and subjected to a high-potential ("HI-POT") test of 3,000 Volts. The substrate did not break down and.the device passed the test. As discussed above, because the isolating element is an integral part of the packaged device, the isolating element will always be installed, and not forgotten, as is possible when using conventional isolating pads or washers. Thus, power semiconductor die packaged according to the present invention are safer than corresponding conventional products.

While the invention has been particularly shown and described with reference to a specific embodiment thereof, it will be understood by those skilled in the art that the foregoing and other changes in the form and details may be made therein without departing from the spirit or scope of the invention. For example, while a TO-247 package was used to illustrate the present invention, other package types, both standard and non-standard, could be applied to the present invention. These and other equivalents and alternatives are intended to be included within the scope of the present invention. Therefore, the scope of this invention should not be limited to the embodiments described above, and should instead be defined by the following claims.

What is claimed is:

1. A method of fabricating a packaged power semiconductor device, the method comprising:
   (a) placing a direct-bonded copper ("DBC") substrate in an assembly fixture;
   (b) placing a solder preform on the DBC substrate;
   (c) placing a leadframe on the solder preform;
   (d) placing a power semiconductor die on the solder preform; and
   (e) firing the assembly fixture to solder the leadframe and the power semiconductor die to the DBC substrate.

2. The method of claim 1 further comprising:
   encapsulating the DBC substrate and power semiconductor die; and
   trimming the leadframe to separate leads of the packaged power semiconductor device.

3. The method of claim 1 wherein a plurality of DBC substrates, a plurality of solder preforms, and a plurality of power semiconductor dice are disposed in the assembly fixture.

4. The method of claim 3 wherein the plurality of power semiconductor dice includes at least two device types.

5. The method of claim 1 wherein the assembly fixture comprises graphite.

* * * * *

UNITED STATES PATENT AND TRADEMARK OFFICE
CERTIFICATE OF CORRECTION

PATENT NO.   : 6,534,343 B2
DATED        : March 18, 2003
INVENTOR(S)  : Kang Rim Choi It is certified that error appears in the above-identified patent and that said Letters Patent is hereby corrected as shown below:

<u>Title page, Item [54] and Column 1, lines 1-3,</u>
Please correct the title so it reads as -- ELECTRICALLY ISOLATED POWER SEMICONDUCTOR PACKAGE --.

Signed and Sealed this

Twenty-second Day of July, 2003

JAMES E. ROGAN
*Director of the United States Patent and Trademark Office*